United States Patent
Chang et al.

(10) Patent No.: US 8,664,087 B2
(45) Date of Patent: Mar. 4, 2014

(54) METHOD OF MANUFACTURING A SEMICONDUCTOR STRUCTURE AND SEPARATING THE SEMICONDUCTOR FROM A SUBSTRATE

(75) Inventors: Shih-Pang Chang, Hsinchu (TW); Hung-Chi Yang, Hsinchu (TW); Yu-Jiun Shen, Hsinchu (TW)

(73) Assignee: EPISTAR Corporation, Hsinchu (TW)

( * ) Notice: Subject to any disclaimer, the term of this patent is extended or adjusted under 35 U.S.C. 154(b) by 0 days.

(21) Appl. No.: 13/310,342

(22) Filed: Dec. 2, 2011

(65) Prior Publication Data
US 2012/0142142 A1 Jun. 7, 2012

(30) Foreign Application Priority Data
Dec. 2, 2010 (TW) ................ 99142037 A (51) Int. Cl.
*H01L 21/30* (2006.01)
*H01L 21/46* (2006.01)

(52) U.S. Cl.
USPC .................... 438/459; 257/E21.57

(58) Field of Classification Search
USPC .................... 438/459; 257/E21.57
See application file for complete search history.

(56) References Cited

U.S. PATENT DOCUMENTS

| | | | |
|---|---|---|---|
| 7,781,790 B2 * | 8/2010 | Minato et al. | 257/98 |
| 8,372,673 B2 | 2/2013 | Lee et al. | |
| 2008/0017100 A1 | 1/2008 | Chyi et al. | |
| 2009/0197118 A1 * | 8/2009 | Nagai et al. | 428/698 |

FOREIGN PATENT DOCUMENTS

| | | |
|---|---|---|
| TW | 540171 B | 7/2003 |
| TW | 200806829 A | 2/2008 |
| TW | 200919576 A | 5/2009 |

* cited by examiner

*Primary Examiner* — William D Coleman
(74) *Attorney, Agent, or Firm* — Muncy, Geissler, Olds & Lowe, PLLC (57) ABSTRACT

A method of manufacturing a semiconductor structure is disclosed, which includes providing a substrate comprising a bottom surface and a growth surface opposite to the bottom surface; forming a buffer layer comprising a first surface which is not a C-plane substantially parallel with the bottom surface on the growth surface; forming a semiconductor structure on the buffer layer; forming at least one cavity in the buffer layer; extending the cavity along a main extending direction; separating the substrate and the semiconductor structure; wherein the main extending direction is substantially not parallel with the normal direction of the first surface.

15 Claims, 7 Drawing Sheets

METHOD OF MANUFACTURING A SEMICONDUCTOR STRUCTURE AND SEPARATING THE SEMICONDUCTOR FROM A SUBSTRATE

TECHNICAL FIELD

The disclosure relates to a manufacturing method in accordance with a semiconductor structure, especially relates to a method in accordance with separating a semiconductor structure and a sapphire substrate by wet etching.

REFERENCE TO RELATED APPLICATION

This application claims the right of priority based on TW application Serial No. 099142037, filed on Dec. 2, 2010, and the content of which is hereby incorporated by reference in its entirety.

DESCRIPTION OF BACKGROUND ART

As the technology improves day by day, the semiconductor optoelectronic device makes large contribution in data transmission and in energy conversion. Take the systematic application as an example, the semiconductor optoelectronic device can be applied to the optical-fiber communication, the optics storage, and the military affairs. Classified by the way of conversion of the energy, the semiconductor optoelectronic device can be separated into three types: converting the electrical power into the light emission, such as the light-emitting diode and the laser diode; converting the light signal into the electrical power, such as the light detector; converting the light radiation energy into the electrical power, such as the solar cell.

For the semiconductor optoelectronic devices, the growth substrate plays a very important role. The essential semiconductor epitaxial structures which are used to form the semiconductor optoelectronic device are formed on the growth substrate. Therefore, how to choose a suitable growth substrate often becomes an important issue which could determine the quality of the semiconductor optoelectronic device.

However, sometimes a substrate suitable for device growth thereon is not a suitable substrate for device operation. Take the light emitting diode device for example, in the conventional red light emitting diode device manufacturing process, in order to improve the device growth quality, the opaque GaAs substrate which has the lattice constant close to that of the semiconductor epitaxial structure is often chosen to be the growth substrate. However, for the light emitting diode device which is operated to emit light, the opaque growth substrate degrades the light emitting efficiency during operation. In order to satisfy the different requirements for the growth substrate and the operating substrate of the semiconductor optoelectronic device, the substrate transferring technology is developed. In other words, the semiconductor epitaxial structure grows from the growth substrate first, and the semiconductor epitaxial structure is transferred to the operating substrate for later device operation later. After adhering the semiconductor epitaxial structure to the operating substrate, the removal of the original growth substrate becomes the key of the transferring technology.

The conventional methods of removing the growth substrate mainly include dissolving the growth substrate by the etchant, cutting away the substrate by the physical method, or forming a sacrificial layer between the growth substrate and the semiconductor epitaxial structure in advance, and separating the growth substrate and the semiconductor epitaxial structure by etching away the sacrificial layer and so on. However, no matter what method mentioned above is adopted, it damages the growth substrate so the growth substrate could not be reused, and therefore cause a waste.

SUMMARY OF THE DISCLOSURE

In accordance with the description above, the present disclosure provides a manufacturing method of a semiconductor structure, especially relates to a method of separating a semiconductor structure and a sapphire substrate by wet etching.

A method of manufacturing a semiconductor structure in accordance with one embodiment of the disclosure is disclosed, which includes providing a substrate comprising a bottom surface and a growth surface opposite to the bottom surface; forming a buffer layer comprising a first surface which is not a C-plane substantially parallel with the bottom surface on the growth surface; forming a semiconductor structure on the buffer layer; forming at least one cavity in the buffer layer; extending the cavity along a main extending direction; separating the substrate and the semiconductor structure; wherein the main extending direction is substantially not parallel with the normal direction of the first surface.

DETAILED DESCRIPTION OF PREFERRED EMBODIMENTS

Figure 1A:
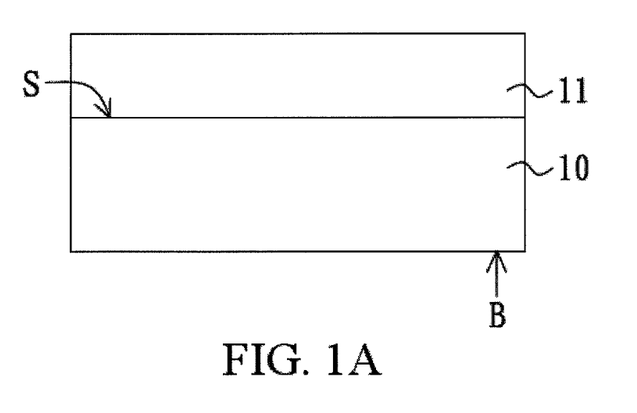
FIG. 1A illustrates a structure of the first step of manufacturing a semiconductor structure in accordance with an embodiment of the disclosure.

Referring to FIG. 1A to FIG. 1F, a method of separating the substrate 10 and the semiconductor structure 15 by wet etching is disclosed in accordance with an embodiment of the present disclosure. First, as shown in FIG. 1A, a substrate 10 of sapphire with trigonal crystalline group structure is provided. The substrate 10 includes a bottom surface B and another surface S opposite to the bottom surface B. In the present embodiment, the surface S is an R-plane {01-12} crystalline surface of the sapphire substrate 10.

Figure 1B:
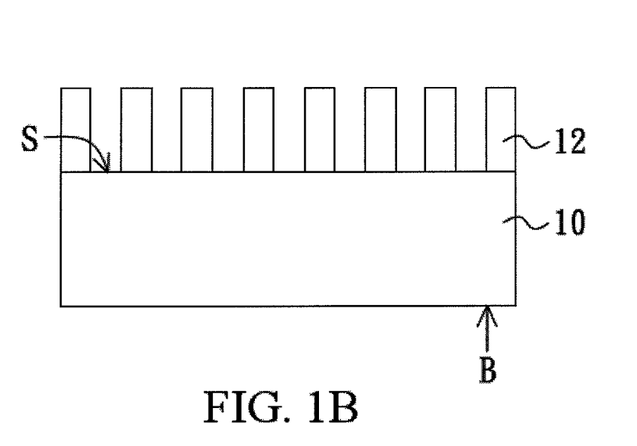
FIG. 1B illustrates a structure of the second step of manufacturing a semiconductor structure in accordance with an embodiment of the disclosure.

Then, as shown in FIG. 1B, with the surface S of the substrate 10 as the growth surface, an undoped gallium nitride layer 11 (u-GaN) is deposited thereon, and is vertically etched to a predetermined depth by the reactive ion etch method (RIE) to form a plurality of uniformly arranged GaN nano-pillars 12. And then, the GaN nano-pillars 12 is used as the seed layer for the homogeneous epitaxial growth to make the GaN structure formed continuously. During epitaxial growth, the lateral epitaxial growth rate is larger than the vertical epitaxial growth rate in the homogeneous epitaxial process, and therefore the GaN materials on the GaN nano-pillars 12 laterally connect to each other to form a GaN buffer layer 14 with a plurality of cavities 13 therein. Wherein, the completed buffer layer 14 includes a first surface F substantially parallel to the bottom surface B of the substrate 10. In the present embodiment, the buffer layer 14 formed on the surface S (R-plane {01-12}) of the sapphire substrate 10, and the first surface F formed on the buffer layer 14 is an A-plane {11-20} as the structure shown in FIG. 1C. Wherein, the material of the buffer layer 14 could include but is not limited to the hexagonal crystalline group material such as u-GaN, n-GaN, p-GaN, AlN, InN, AlGaN, InGaN, and so on. The method of forming the buffer layer 14 can be metal-organic chemical vapor deposition (MOCVD), hydride vapour phase epitaxy (HYPE), and so on.

Figure 1C:
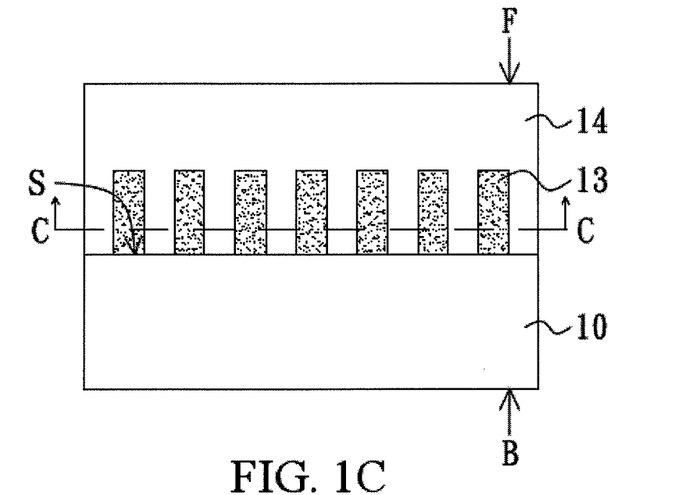
FIG. 1C illustrates a structure of the third step of manufacturing a semiconductor structure in accordance with an embodiment of the disclosure.
Figure 1D:
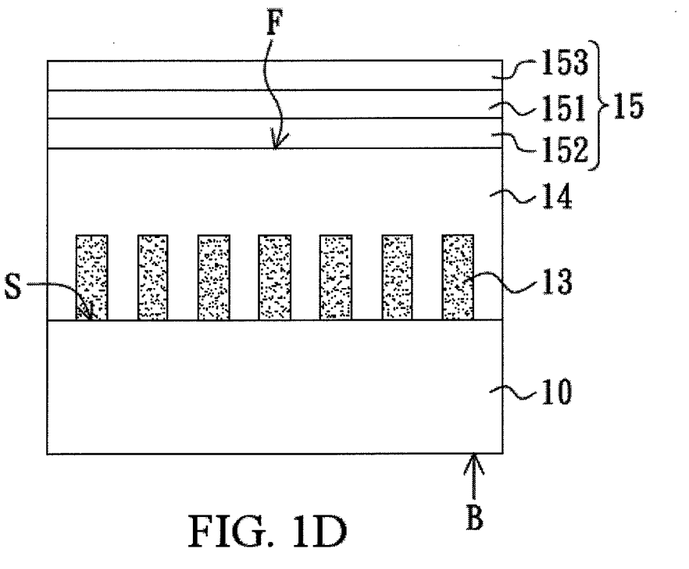
FIG. 1D illustrates a structure of the fourth step of manufacturing a semiconductor structure in accordance with an embodiment of the disclosure.

As shown in FIG. 1D, a semiconductor structure 15 is formed on the GaN buffer layer 14. Take the present embodiment as an example, the semiconductor structure 15 is a light emitting diode structure including an active layer (light emitting layer) 151, an n-type nitride layer 152, and a p-type nitride layer 153 formed on two sides of the active layer (light emitting layer) 151. Wherein, the structure of the active layer (light emitting layer) 151 can be a single heterostructure (SH), a double heterostructure (DH), a double-side double heterostructure (DDH), or a multi-quantum well (MQW) structure. Take the present embodiment as an example, the composition of the active layer (light emitting layer) 151, the p-type nitride layer 153, and the n-type nitride layer 152 can be the $Al_xGa_yIn_zN$ (x+y+z=1) structures with the same or different atomic contents. Besides, the semiconductor structure 15 can include non-semiconductor material such as metal, organic compound, insulator, oxide, and so on. In one embodiment, the semiconductor structure 15 can further include an indium tin oxide (ITO) layer to enhance the lateral current spreading efficiency. Besides, the outer surface or inner surface of the semiconductor structure 15 can further be patterned to form a specific light field or to raise the light extraction efficiency.

Figure 1E:
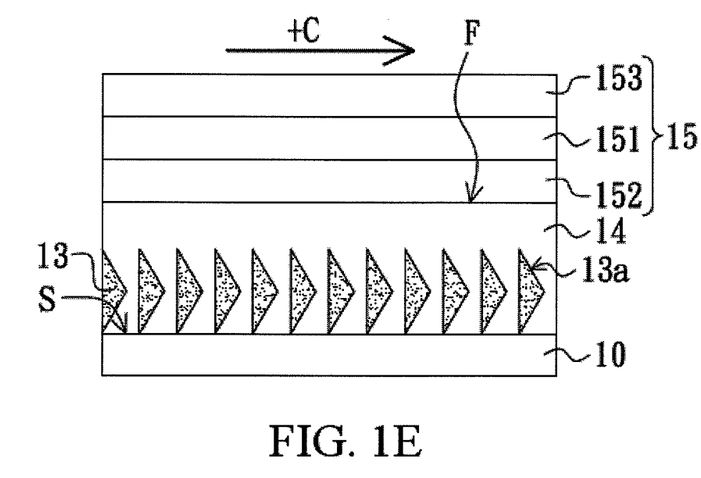
FIG. 1E illustrates a structure of the fifth step of manufacturing a semiconductor structure in accordance with an embodiment of the disclosure.

Then, referring to FIG. 1E, in order to extend the cavities 13, the cavities 13 in the GaN buffer layer 14 are etched by etchant. In the present embodiment, the etching process is performed by selectively etching along the polarity direction of the buffer layer crystal structure. The etchant prefers to work under low concentration and low temperature condition. For example, the potassium hydroxide (KOH) solution with the concentration lower than 50% and the reaction temperature between 80° C. and 180° C. is preferred. As the cavities 13 in the GaN buffer layer 14 are etched by the etchant, the inner surfaces 13a of the cavities 13 extend outward along different crystalline surfaces of the buffer layer with different rates. In the present embodiment, the experimental condition is under 120° C. and in the 10% potassium hydroxide (KOH) solution in ethan-1,2-diol.

Wherein, the factors that influence the profile of the inner surfaces 13a can include but are not limited to the composition of the etchant, the crystalline orientation of the exposed surface of the cavities 13, the geometric arrangement, and the crystal defect and the structure deficiency of the GaN buffer layer 14. In general, when extending the cavities by etchant, because the etchant has different etching rates in different directions, the cavities have many extending directions. In the present embodiment, the etching rates of the KOH solution along different crystalline surfaces of the GaN buffer layer 14 are:

$$-C\text{-plane} > M\text{-plane} > A\text{-plane} > +C\text{-plane}$$

Figure 1F:
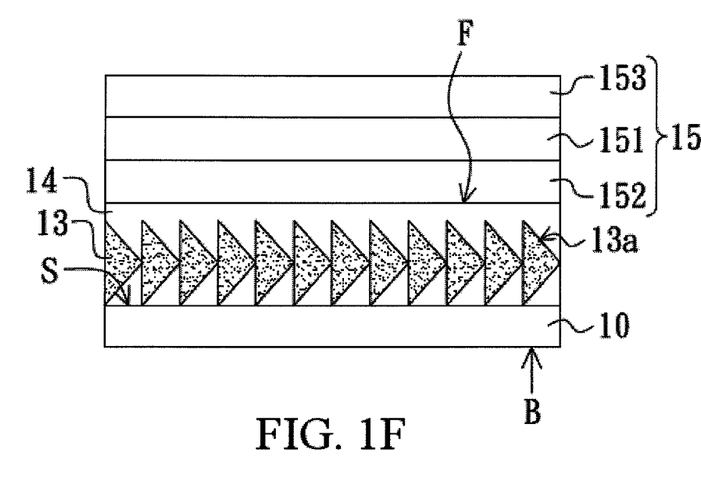
FIG. 1F illustrates a structure of the sixth step of manufacturing a semiconductor structure in accordance with an embodiment of the disclosure.

Because the first surface F of GaN buffer layer 14 is A-plane {11-20}, the right side in the figure (perpendicular to the normal of the first surface F) is +C direction of GaN buffer layer 14 and the surface on the right hand side is −C surface. When the direction the cavities 13 have the largest extension rate is the main extending direction, the cavities 13 perpendicular to the first surface F of GaN buffer layer 14 extends along +C direction (right side in the figure, perpendicular to the normal of the first surface F) as the main extending direction until the inner surface 13a close to or become a specific surface group, and the etching rate becomes very slow in the present embodiment. In other words, the specific surface group could be regarded as an etching stop surface. For GaN structure, the specific surface group is the {11-22} surface group or the {10-11} surface group. As shown in FIG. 1F, part of the inner surfaces 13a of the cavities 13 are etched to be the {11-22} surface group (or the {10-11} surface group), and the included angle of the direction of the {11-22} surface group (or the {10-11} surface group) and the direction of the normal of the surface F of the GaN buffer layer 14 is 58° (or 62°). Besides, theoretically, the inner surfaces 13a which become the specific {11-22} surface group (or the {10-11} surface group) should have the same etching rate, and the cross-sections of the cavities 13 should be equilateral triangles which have the same lateral sides. The cavities 13 of equilateral triangle structures have the bottom sides along the normal direction of the substrate 10, and the included angles of the two sides and the bottom should be 58° (or 62°). Meanwhile, if the etching process continues, the equilateral triangle keeps extending along the {11-22} surface group (or {10-11} surface group), which means extending along the direction which keeps the extended equilateral triangle has the same included angles relative to the surface S of the substrate. To be noticed, the etching rate now becomes very slow and is below one-tenth of the original rate.

Figure 2:
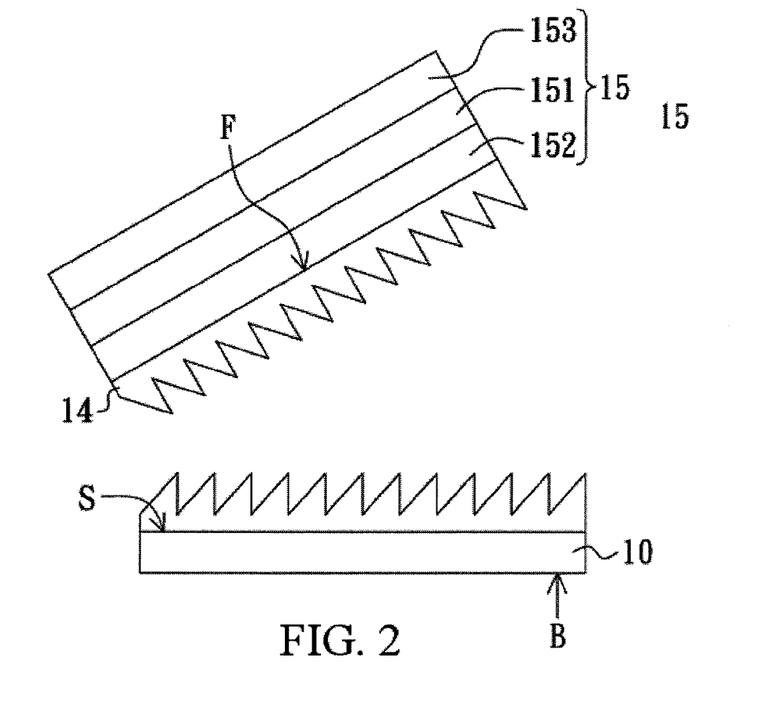
FIG. 2 illustrates a structure of separating a semiconductor structure and a substrate in accordance with an embodiment of the disclosure.

As mentioned above, the width of the cavities 13 and the distance between the cavities 13 can be adjusted to have the nearest inner surfaces 13a of the adjacent cavities 13 contacted to each other after being etched. In the present embodiment, by controlling the etching rate and the duration, the inner surfaces 13a of the adjacent cavities 13 could be close enough to almost or totally contact to each other and the weak connection between the semiconductor structure 15 and the sapphire substrate 10 could be broken or have been broken. Meanwhile, as shown in FIG. 2, if an external force such as vibration, shearing stress, tensile stress, press stress, or thermal expansion is applied, the semiconductor structure 15 and the substrate 10 can be separated easily.

Besides the methods mentioned above, the cavities 13 can also be formed by dry etching such as photolithography method or inductive coupling plasma (ICP) method. The GaN buffer layer 14 and the semiconductor structure 15 thereon can be formed by metal-organic chemical vapor deposition (MOCVD), hydride vapour phase epitaxy (HVPE), or other applicable method.

Figure 3A:
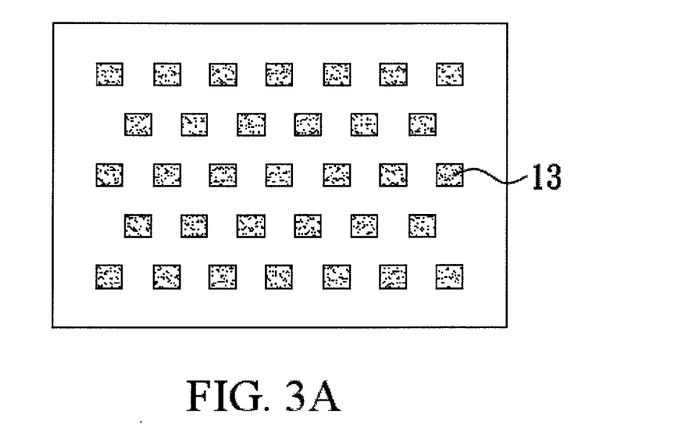
FIG. 3A illustrates a top view of a semiconductor structure dissected along line C-C in FIG. 1C in accordance with an embodiment of the disclosure.
Figure 3B:
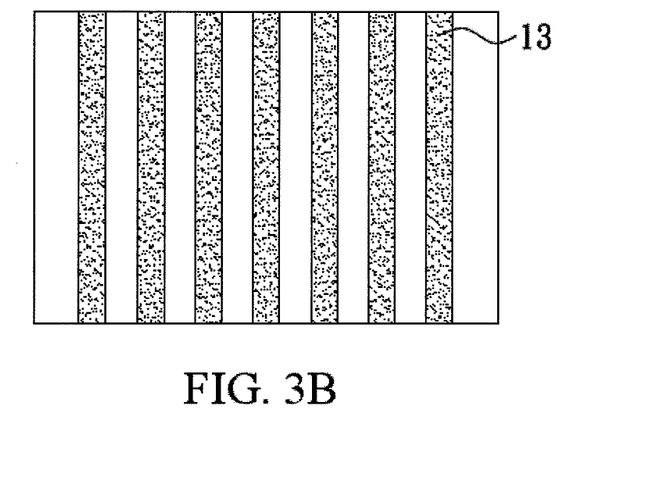
FIGS. 3B-3D illustrate the top views of the semiconductor structures dissected along line C-C in FIG. 1C in accordance with other embodiments of the disclosure.
Figure 3C:
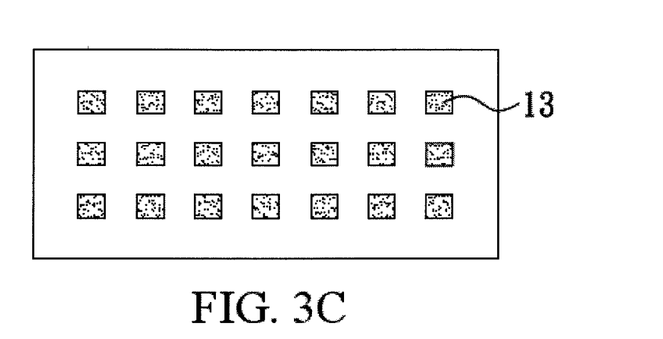
Figure 3D:
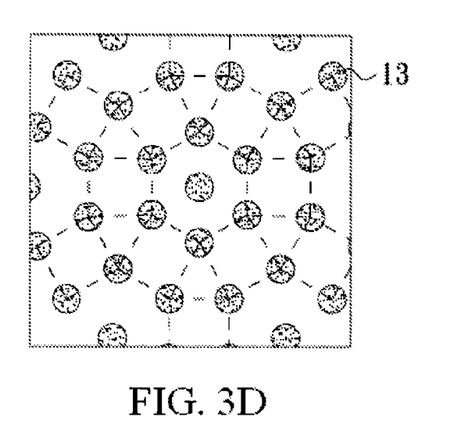

FIG. 3A shows the top view of the semiconductor structure dissected along line C-C in FIG. 1C. As shown in the top view, the pattern of the cavities 13 arranged regularly alternatively. However, the pattern should not be limited to what is shown this embodiment. As shown in FIGS. 3B-3D, the pattern of the cavities 13 could be channel type, matrix type, 12-folded type, and so on. Besides, the arrangement of the cavities 13 can also be irregular. People with ordinary skill in the art could realize the irregular arrangement of the cavities 13 also have similar effects.

Then, other embodiments are disclosed. Take the direction of the first surface F as an example, the first surface F of GaN buffer layer could be one M-plane {10-10} or R-plane {01-12} crystalline surface which is not parallel with C plane. By extending +C direction of the inner surfaces of the cavities in GaN buffer layer, a gradually connected separating part could be formed in the buffer layer. Therefore, the semiconductor structure and the substrate could be separated and the separated substrate could be intact for reuse.

Figure 4A:
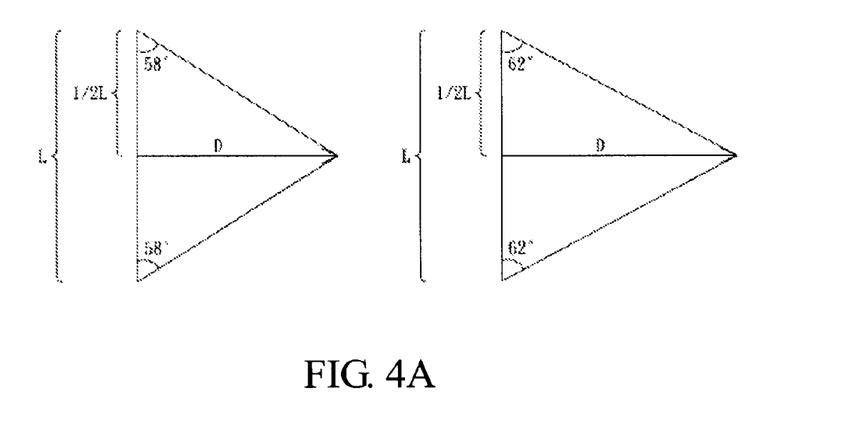
FIG. 4A illustrates a diagram of a cavity in accordance with an embodiment of the disclosure.

Besides, the distance between the cavities 13 could be adjusted. As the embodiment mentioned above, when the buffer layer structure is etched by etchant to an etching stop surface, the etching rate becomes very slow. Take the present embodiment as an example, when taking the inner surfaces of the cavities perpendicular to GaN buffer layer (+C direction) as the bottom sides of the triangles, the etching process achieves the etching stop surfaces when the cavities become the equilateral triangles which have the included angles of 58° or 62° with the bottom sides. As shown in FIG. 4A, if the length of the bottom side is L, when achieving the etching stop surface, the etching distance D in +C direction which has the largest etching rate has the formula as shown below:

$$D=0.5L*\tan 58° \text{ or } D=0.5L*\tan 62°$$

Figure 4B:
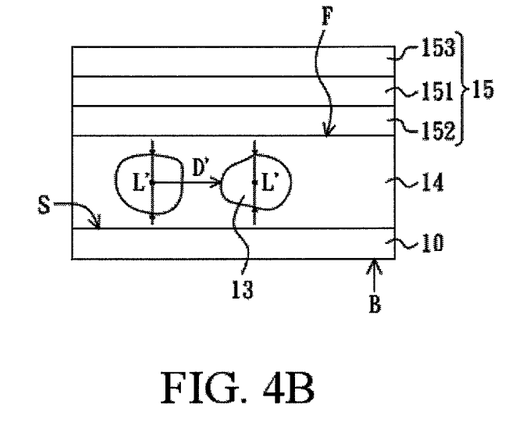
FIG. 4B illustrates a structure of a semiconductor structure in accordance with another embodiment of the disclosure.

Referring to the formula mentioned above, in order to have a faster separating rate, the distances between the cavities equal to or smaller than D are preferred. In other words, before achieving the etching stop surface, the cavities could extend along +C direction which has the faster etching rate. Besides, the cavities are not limited to rectangular shape as shown in the embodiment. Therefore, as shown in FIG. 4B, when two adjacent cavities in GaN buffer layer 14 have the largest lengths L' and L" in +C direction, the two adjacent cavities have the faster etching rate when the distance D' between the two adjacent cavities satisfies the following relationship:

$$D'\leq 0.5L'*\tan 58° \text{ or } D'\leq 0.5L*\tan 62°$$

For the same reason, it is preferred to arrange the cavities satisfying the relationship to have the faster etching rate.

The embodiments mentioned above are used to describe the technical thinking and the characteristic of the invention and to make the person with ordinary skill in the art to realize the content of the invention and to practice, which could not be used to limit the claim scope of the present application. Any modification or variation according to the spirit of the present application should also be covered in the claim scope of the present disclosure.

What is claimed is:

1. A method of manufacturing a semiconductor structure, comprises:

providing a substrate comprising a bottom surface and a growth surface opposite to the bottom surface;

forming a buffer layer comprising a first surface which is not a C-plane substantially parallel with the bottom surface;

forming a semiconductor structure on the first surface of the buffer layer;

forming at least one cavity in the buffer layer;

extending the cavity along a main extending direction; and separating the substrate and the semiconductor structure;

wherein the main extending direction is substantially not parallel with the normal direction of the first surface.

2. The method of manufacturing a semiconductor structure as claimed in claim 1, wherein the main extending direction is the direction that the cavity has the largest extending rate.

3. The method of manufacturing a semiconductor structure as claimed in claim 1, wherein the main extending direction is substantially perpendicular to the normal direction of the first surface.

4. The method of manufacturing a semiconductor structure as claimed in claim 1, wherein a plurality of cavities are arranged regularly in the buffer layer.

5. The method of manufacturing a semiconductor structure as claimed in claim 1, wherein the cavity is extended by wet etching and the etchant comprises potassium hydroxide (KOH).

6. The method of manufacturing a semiconductor structure as claimed in claim 1, wherein the material of the substrate is a poly crystal material or a single crystal material.

7. The method of manufacturing a semiconductor structure as claimed in claim 1, wherein the buffer layer is a hexagonal crystalline group system.

8. The method of manufacturing a semiconductor structure as claimed in claim 1, wherein the cavity located in the buffer layer comprises a second crystalline surface and the second crystal surface is a {11-22} surface group or a {10-11} surface group.

9. The method of manufacturing a semiconductor structure as claimed in claim 1, further comprising forming a plurality of nano-scale pillars on the substrate.

10. The method of manufacturing a semiconductor structure as claimed in claim 1, wherein the method of forming the semiconductor structure further comprising:

forming a p-type semiconductor layer; and forming a n-type semiconductor layer on the p-type semiconductor layer.

11. The method of manufacturing a semiconductor structure as claimed in claim 1, wherein the substrate and the semiconductor structure are separated by providing an external force to separate the substrate and the semiconductor structure from the cavity.

12. The method of manufacturing a semiconductor structure as claimed in claim 6, wherein the material of the substrate is selected from the material of sapphire, silicon (Si), silicon carbide (SiC), zinc oxide (ZnO), lithium tantalite (LAO), or aluminum nitride (AlN).

13. The method of manufacturing a semiconductor structure as claimed in claim 7, wherein the buffer layer is a nitride semiconductor epitaxial layer.

14. The method of manufacturing a semiconductor structure as claimed in claim 13, wherein the buffer layer is a gallium nitride (GaN) semiconductor epitaxial layer.

15. The method of manufacturing a semiconductor structure as claimed in claim 10, wherein the method of forming the semiconductor structure further comprising:

forming an active layer between the p-type semiconductor layer and the mi-type semiconductor layer.

* * * * *